United States Patent
Lim et al.

(10) Patent No.: US 6,897,555 B1
(45) Date of Patent: May 24, 2005

(54) INTEGRATED CIRCUIT PACKAGE AND METHOD FOR A PBGA PACKAGE HAVING A MULTIPLICITY OF STAGGERED POWER RING SEGMENTS FOR POWER CONNECTION TO INTEGRATED CIRCUIT DIE

(75) Inventors: Hong Tee Lim, San Jose, CA (US); Wee Keong Liew, San Jose, CA (US); Chengyu Guo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/626,366

(22) Filed: Jul. 23, 2003

(51) Int. Cl.$^7$ .......................... H01L 23/48; H01L 23/52; H01L 29/40
(52) U.S. Cl. ........................ 257/692; 257/691; 257/698; 257/780; 257/738; 257/774; 257/784; 257/773; 257/786
(58) Field of Search ................................. 257/692, 691, 257/698, 738, 780, 774, 784, 773, 786

(56) References Cited

U.S. PATENT DOCUMENTS 5,530,287 A * 6/1996 Currie et al. ............... 257/692
5,801,440 A * 9/1998 Chu et al. ................... 257/691

* cited by examiner

*Primary Examiner*—Nitin Parekh
(74) *Attorney, Agent, or Firm*—Beyer Weaver & Thomas, LLP

(57) ABSTRACT

A BGA package having a multiplicity of power segments configured for power connection to integrated circuit die is disclosed. The BGA package substrate includes an integrated circuit die and a ground ring. The substrate also includes a first power ring with a plurality of spaced apart first power ring segments arranged around the die. A second power ring having a plurality of spaced apart conductive second ring segments is also formed around the die. A plurality of vias that penetrate through the substrate are provided to accommodate electrical connections to the segments of the first and second power rings and to the ground ring. The package includes bonding wires for connecting the die to the first and second ring segments and ground ring. Additionally, the package is commonly encapsulated to protect the die and wires. In some implementations, the conductive first ring segments are arranged in staggered configuration relative to the conductive second ring segments with each of the first ring segments having a conductive tab configured so that it passes through spaces between the conductive second ring segments. The tabs electrically connecting the first ring segments to vias.

26 Claims, 4 Drawing Sheets

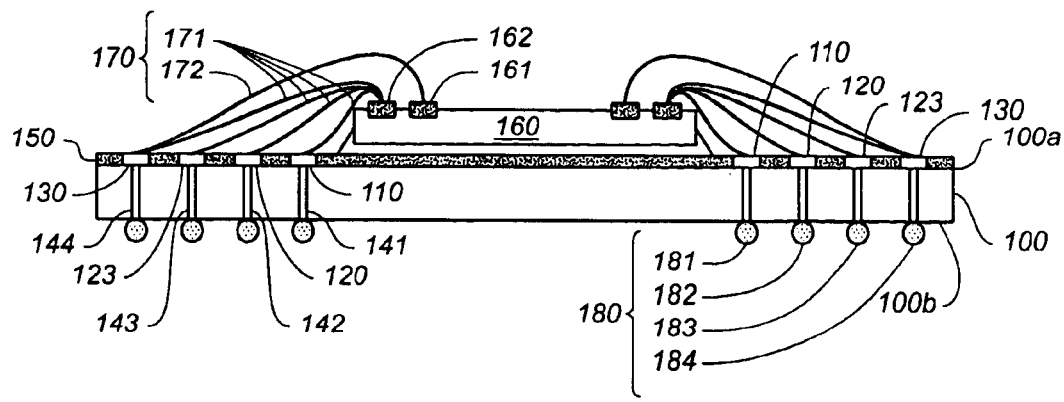
FIG._1A *(PRIOR ART)*
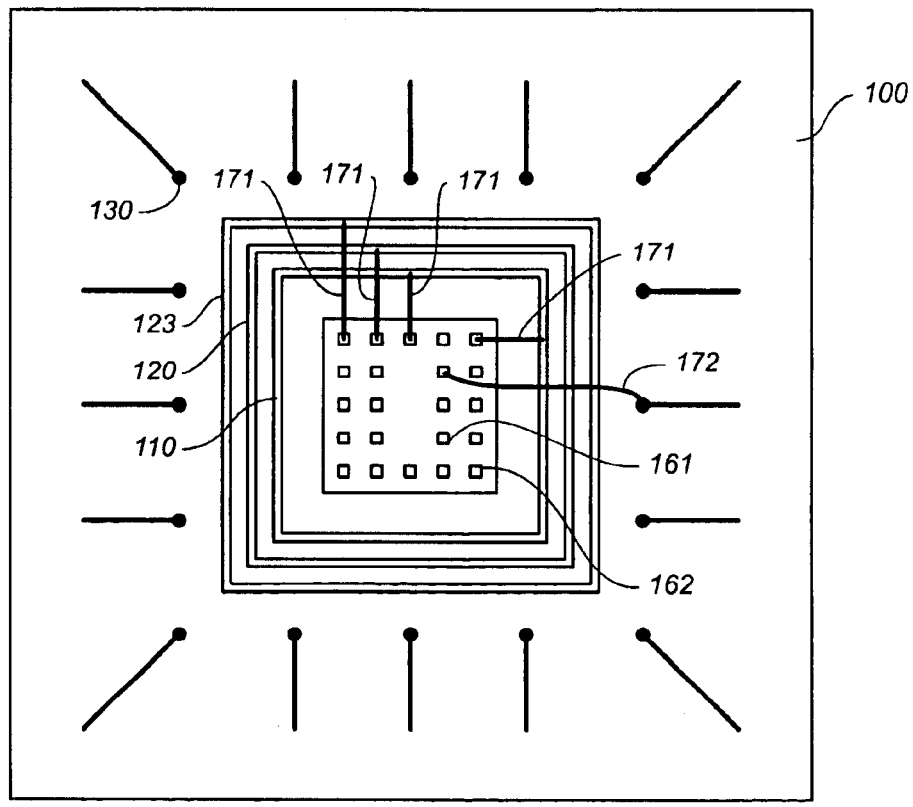
FIG._1B *(PRIOR ART)*

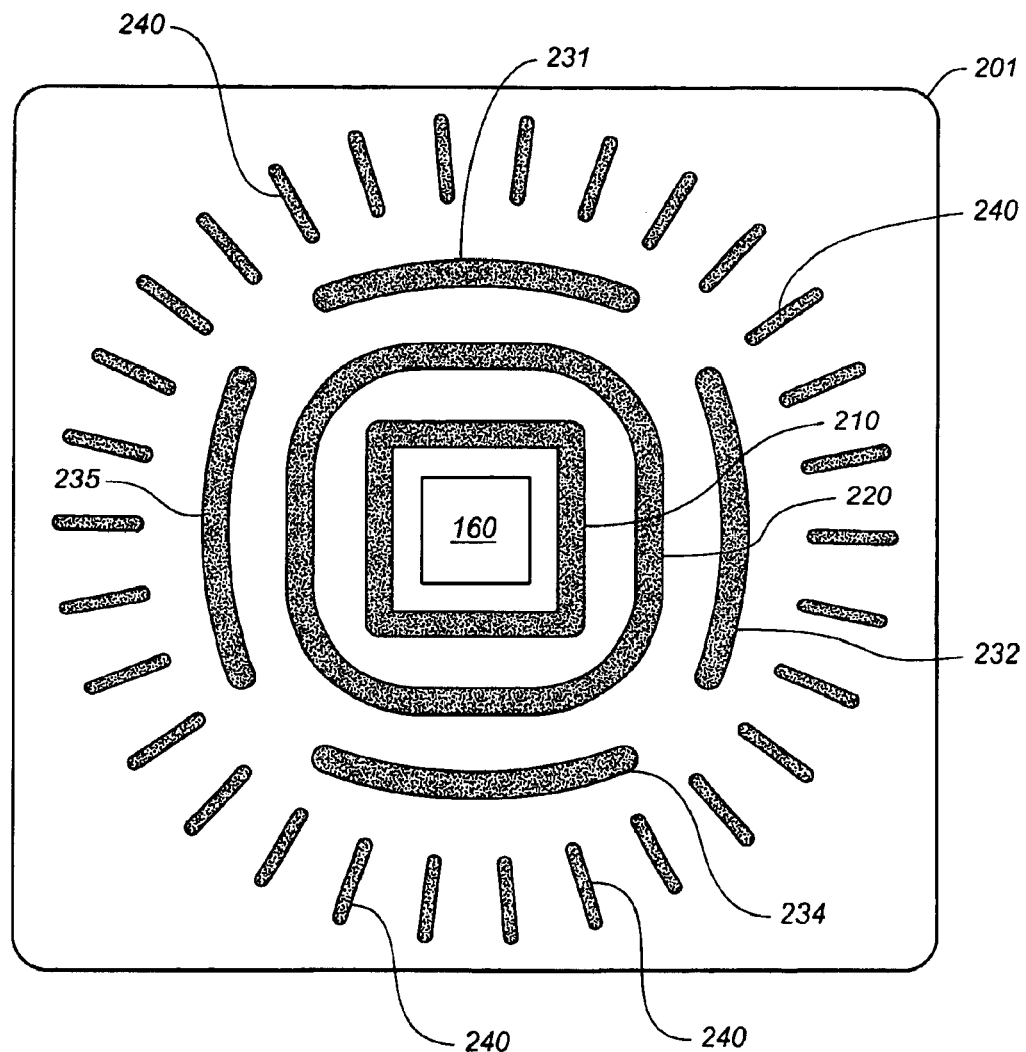
FIG._2
(PRIOR ART)

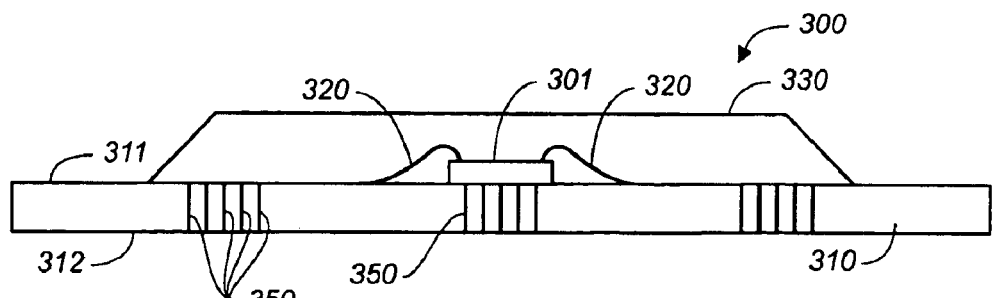
FIG._3
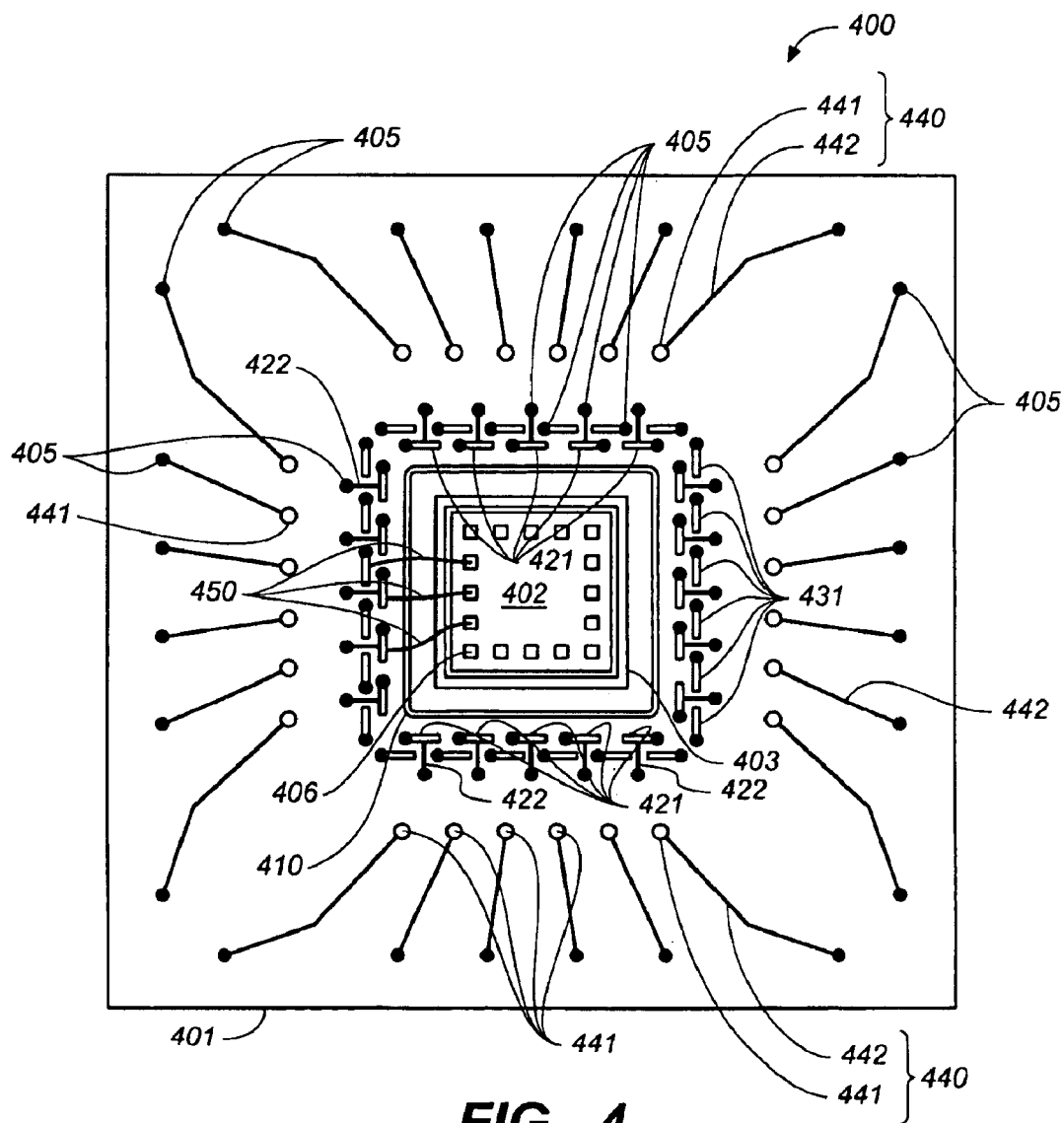
FIG._4

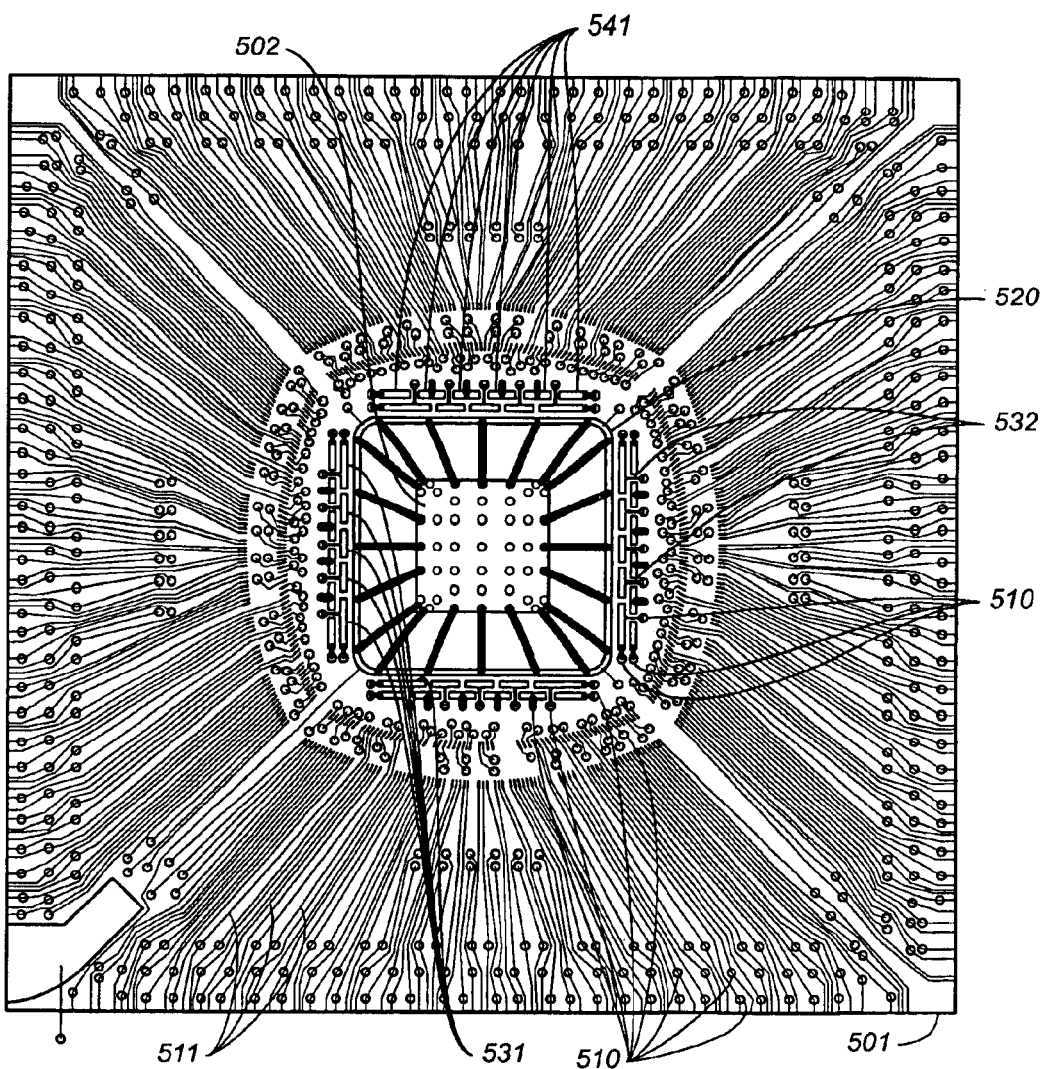
FIG._5

US 6,897,555 B1

INTEGRATED CIRCUIT PACKAGE AND METHOD FOR A PBGA PACKAGE HAVING A MULTIPLICITY OF STAGGERED POWER RING SEGMENTS FOR POWER CONNECTION TO INTEGRATED CIRCUIT DIE

FIELD OF THE INVENTION

The present invention relates generally to integrated circuit packages. More specifically, the present invention relates to packaging of dies onto substrates that include segmented power rings arranged around the die of a ball grid array type integrated circuit package.

BACKGROUND OF THE INVENTION

BGA (Ball Grid Array) is an advanced type of semiconductor packaging technology which is characterized in the use of a substrate whose front side is mounted with a semiconductor die and whose back side is mounted with a grid array of solder balls. During SMT (Surface Mount Technology) process, the BGA package can be mechanically bonded and electrically coupled to an external printed circuit board (PCB) by means of these solder balls.

Typically, the BGA substrate includes one or two power rings and a ground ring formed on the front side thereof. The power rings are ring-shaped electrically-conductive traces that surround the packaged die and is used to deliver the power from the external PCB to the packaged chip during operation. Additionally, the substrate commonly includes a ground ring comprising a ring-shaped electrically-conductive trace arranged alongside the power rings. The ground ring is used to connect the ground pads of the packaged die to grounding lines on the external PCB.

Surrounding the power and ground rings are a multiplicity of I/O traces which are used to connect the die to an associated multiplicity of I/O connections. Current industry emphasis on decreased size and increased functionality of semiconductor die has resulted in the continuing development of integrated circuit die having a high density of active circuits. Conventionally, the logic circuitry of the die is formed on the interior portion of the die and a plurality of input/output (I/O) devices or cells are located around the periphery of the die. Each I/O cell, typically, is connected to at least one bond pad fabricated at the surface of the die that serves as the input/output (I/O) contact for that cell.

Commonly, the dies are mounted on a specifically constructed substrate. Power is supplied to the die through a pair of circumferential power rings that surround the die and are located on an inner portion of a front surface of the substrate. Typically, the dies are connected to power rings by a plurality of bond wires. In conventional applications, such dies are limited to only two power voltages (one for each power ring). In some alternative applications, the outer power ring is split into four (4) power sources. Thus, in some implementations, as many as five different voltages can be supplied to a die. This is the upper limit of present technologies. In order to gain access to more than five voltages, I/O contacts must be sacrificed in order to accommodate additional power supply voltage needs. Where many power voltages are required, this causes a serious reduction of the available I/O connections. Additionally, numerous other disadvantageous of the present art will be described hereinbelow.

FIG. 1A shows a very simplified cross-section schematic view a typical BGA package with power ring and ground ring (note that FIG. 1A is simplified schematic diagram showing only a small number of components, the actual BGA structure and circuit layout may be much more complex).

As shown, this BGA package includes: (a) a substrate 100 having a front side 100a and a back side 100b; (b) a ground ring 110 formed on the front side 100a of the substrate 100; (c) a first power ring 120 formed alongside the ground ring 110 and a second power ring 123 formed alongside the first power ring 120; (d) a plurality of I/O pads 130 formed over the front side 100a of the substrate 100; (d) a plurality of vias (electrically-conductive through-holes) 141, 142, 143, 144 penetrating the substrate 100, which include a subgroup of ground vias 141 each having an upper end connected to the ground ring 110 and a bottom end exposed on the back side 100b of the substrate 100; a subgroup of first power vias 142 each having an upper end connected to the first power ring 120 and a bottom end exposed on the back side 100b of the substrate 100; a subgroup of second power vias 143 each having an upper end connected to the second power ring 123 and a bottom end exposed on the back side 100b of the substrate 100; a subgroup of I/O vias 144 each having an upper end connected to one of the I/O pads 130 and a bottom end exposed on the back side 100b of the substrate 100; (e) a solder mask 150 which can be optionally formed over the front side 100a of the substrate 100 while exposing the ground ring 110, the first and second power rings 120, 123, and the I/O pads 130; (f) a semiconductor die 160 having for example, inner bond pads 161 and outer bond pads 162, and which is mounted on the front side 100a of the substrate 100 within the area surrounded by the ground ring 110 and the power rings 120, 123; (g) a set of bonding wires 170, including a subset of bonding wires 171 for connecting the chip's outer bond pads 162 to the various rings 110, 120, 123, 130 and another subset of bonding wires 172 for connecting the chip's inner bonding pads 161 to the substrate's I/O pads 130; and (h) a ball grid array (an array of solder balls) 180 provided on the back side 100b of the substrate 100, which includes a subgroup of ground balls 181 bonded to the ground vias 141; a subgroup of first power balls 182 bonded to the first power vias 142; a subgroup of second power balls 183 bonded to the second power vias 143; and a sub-group of I/O balls 184 bonded to the I/O vias 144. When this BGA package is mounted on an external PCB (not shown), it allows the ground balls 181, the power balls 182, 183, and the I/O balls 184 to be coupled respectively to the PCB's $V_{SS}$ (ground line), $V_{DD}$ (system power (s)), and I/O (signal input/output) lines.

FIG. 1B is a simplified schematic plan view of a similar BGA package. Looking down on the substrate 100, the die 160, the ground ring 100, the first and second power rings 120, 123, and I/O bond fingers 130 (bond pads) and associated traces 131 are all well indicated. In the depicted schematic view, chip inner 161 and outer 162 bond pads are shown with exemplar bond wires 170 (e.g., 171, 172) connecting to associated ones of the first and second power rings 120, 123, ground ring 110, and the I/O pads 130.

Conventionally, the foregoing power/ground ring layout scheme on BGA package can be implemented in many various ways.

Another such example layout is depicted in FIG. 2, which is a schematic plan view of another simplified implementation of a BGA package. A semiconductor die 160 is mounted on the substrate 201. The substrate 201 includes a ground line 210; an inner power line 220 (which provides voltage $V_{DD1}$); and four outer power lines 231, 232, 233, 234 (which can be used to provide voltages $V_{DD2}$; $V_{DD3}$; $V_{DD4}$; $V_{DD5}$, respectively). Also provided are traces 240 which are connected to I/O lines. All of these lines and traces can be connected to vias which are connected to back side mounted solder balls. This conventional implementation can supply, at most, five voltages through the power lines (220, 231,232, 233, 234).

Systems requiring more input voltages must make use of the I/O lines to supply these voltages. This has a number of significant disadvantages. First, each I/O line used as a voltage supply line cuts down on the I/O lines available to provide system functionality thereby limiting the usefulness of the final packaged chip. This is especially so when 20, 30, or even 40, or more voltages are required by the systems one the chip. This is becoming more of an issue in modern chip packaging due to the need to isolate more and more different system buses on the chip. Common power sources increase problems with cross over noise between the same busses sharing the same power lines. Thus, there are advantages to be gained by providing separate power voltages. The old method of sacrificing I/O lines suffers from many increasingly significant drawbacks. For example, another disadvantage inherent in using I/O signal traces is the comparatively high impedance caused by narrow line widths of most of these traces.

Thus, what is needed is a method and package for an integrated circuit device that can provide many independent power lines. Especially, advantageous are implementations capable of providing 32 or more separate voltage sources without sacrificing the I/O pin count in the package. Additionally, it would be advantageous if such method and package could provide reduced impedance relative to the impedance experienced by most signal traces used as voltage sources. Also, it is advantageous if such method and package can be configured to isolate switching noise in the power rails for different I/O busses. Moreover, such a method and package would be advantageous if it could be manufactured using standard fabrication technologies currently used to manufacture, for example, current two and four layer PBGA packages.

SUMMARY OF THE INVENTION

In accordance with the principles of the present invention, this disclosure teaches an integrated circuit package and method for a BGA package (e.g., a PBGA package) having a multiplicity of power segments configured for power connection to integrated circuit die.

A first embodiment includes a BGA package, which comprises a substrate having an integrated circuit die mounted on the front side thereof. The front side of the substrate includes an electrically conductive first power ring that includes a plurality of spaced apart conductive first ring segments formed around the die. The front side of the substrate also includes an electrically conductive second power ring having a plurality of spaced apart conductive second ring segments formed around the die and an electrically conductive ground ring formed around the die. The substrate has a plurality of vias that penetrate through the substrate. Such vias include a subgroup of first vias which are connected to the first ring segments of the first power ring; a subgroup of second vias which are connected to the second ring segments of the second power ring; and a subgroup of ground vias which are connected to the ground ring. Additionally, the package includes bonding wires for connecting the die to the first ring segments, second ring segments, and ground ring.

In another embodiment the BGA package is constructed such that at least some of the first ring segments and the second ring segments provide independent power sources.

In another embodiment the plurality of spaced apart conductive first ring segments are arranged in staggered configuration relative to the plurality of spaced apart conductive second ring segments. Additionally, each of the first ring segments includes a conductive tab that electrically connects the first ring segments to at least some of the first vias and such tabs are arranged so that they pass through spaces between the plurality of spaced apart conductive second ring segments.

These and other aspects of the present invention are described in the detailed description of the embodiments set forth hereinbelow.

BRIEF DESCRIPTION OF DRAWINGS

The invention can be more fully understood by reading the following detailed description of the preferred embodiments, with reference made to the accompanying drawings, wherein:

FIG. 1A (PRIOR ART) is a schematic sectional diagram showing the structure of a typical BGA package with power rings and ground ring.

FIG. 1B (PRIOR ART) shows a top view of a BGA package similar to that of FIG. 1A.

FIG. 2 (PRIOR ART) is a simplified schematic diagram shown in top view, which depicts another conventional power/ground ring layout scheme on BGA package.

FIG. 3 is a simplified side cross-section view of an implementation for a BGA package constructed according to the invention.

FIG. 4 is a simplified plan view of an implementation for a BGA package without the encapsulation layer showing the first and second power ring segments in accordance with the principles of the invention.

FIG. 5 is a simplified plan view of yet another example embodiment of a BGA package constructed in accordance with the principles of the invention.

It is to be understood that, in the drawings, like reference numerals designate like structural elements. Also, it is understood that the depictions in the Figures are not necessarily to scale.

DETAILED DESCRIPTION OF PREFERRED EMBODIMENTS

FIG. 3 depicts a side cross-section view of one embodiment of a BGA package having with segmented power rings in accordance with the principles of the invention. Such a package 300 includes a substrate 310 having a semiconductor integrated circuit die 301 mounted thereon. The substrate 310 is commonly formed of a plastic material (in a plastic ball grid array (PBGA) package) in accordance with ordinary fabrication techniques known to those having ordinary skill in the art. Of course, other alternative materials can be used (e.g., ceramic materials). The die 301 is mounted on the front side 311 of the substrate 310. Bond wires 320 electrically connect the electrical systems of the die 301 to the bond pads, traces, power rings, ground rings, and other electrical connections on the substrate 310. Commonly, portions of die 301 and bond wires 320 are encapsulated by an encapsulant 330 (of a type commonly used in the semiconductor packaging art) to protect and encase the delicate inner components of the chip package. Additionally, a multiplicity of vias 350 are depicted penetrating through the substrate 310. The bonding wires and other electrical connections are made on the front side 310 of the substrate which are then electrically connected to the tops of the vias 350 on the front side 310 of the substrate. As before the vias penetrate through the substrate to make appropriate electrical connections. The depicted embodiment is a ordinary two-layer PBGA package. The principles of the invention also encompass embodiments having four and six (or more) layers. Such packages can include enhanced plastic ball grid arrays (EPBGA). The back side of the substrate 310 typically has a plurality of solder balls formed thereon (not shown in this view). The vias are electrically connected to the solder balls.

FIG. 4 shows a very simplified cross-section schematic view a typical BGA package constructed in accordance with the principles of the invention. In this embodiment the power rings are constructed in a plurality of power ring segments to more easily facilitate the implementation of multiple separate voltages (note that FIG. 4 is simplified schematic diagram showing only a small number of components, the actual BGA structure and circuit layout may be much more complex).

The depicted BGA package 400 shows the front side of a substrate 401 with a ground ring 410 formed on the front side of the substrate 401. Such substrates are formed of materials used for such purposes. Preferred materials include thermally stable materials (e.g., BT resins (bismaleimide-triazine), ceramics, and the like). The substrate 401 can be formed to a number of different sizes. Common sizes being 23×23 mm$^2$; 27×27 mm$^2$; 31×31 mm$^2$; 35×35 mm$^2$; 40×40 mm$^2$; etc. A semiconductor die 402 is typically mounted on the front side of the substrate 401. In one typical implementation, the die 402 is formed on a die attach pad 403 on the front side of the substrate 401. The substrate 401 includes a multiplicity of vias 405 that penetrate through the substrate 401. Such vias 405 can penetrate to differing levels of the substrate 401 in order to make electrical contacts with various circuit elements of the substrate 401. Although depicted here as a simple two-level substrate, the invention contemplates many different embodiments including four and six or more layer substrates. Such vias 405 are filled with conductive material and are electrically connected to solder balls on the back side of the substrate 401.

The substrate 401 includes a plurality of I/O contacts 440 arranged around the outer portions of the packaging substrate 401. For example, the I/O contacts 440 can include conductive bond pads 441 (also commonly referred to as bond fingers) and conductive traces 442. The package 400 further includes an electrically conductive first power ring comprising a plurality of spaced apart conductive first ring segments 421 formed on the front side of the substrate 401. The first ring segments 421 are arranged around the die 402. The package 400 also includes an electrically conductive second power ring that includes a plurality of spaced apart conductive second ring segments 431 formed on the front side of the substrate. The second power ring is arranged around the die 402 and around the first power ring (e.g., segments 421) resulting in a second power ring positioned at a greater distance from the die than that the first power ring. The first ring segments 421 and second ring segments 431 are electrically connected with associated vias 405 to enable power to be supplied to the segments 421, 431. Each first ring segment 421 is capable of providing its own voltage. Such voltages can be electrically isolated from the other segments 421, 431. Similarly, each second ring segment 431 is capable of providing an independent voltage which also can be electrically isolated from the other segments 421, 431.

In the depicted embodiment, the spaced apart conductive first ring segments 421 are arranged in staggered configuration relative to the plurality of spaced apart conductive second ring segments 431. Additionally, each of the first ring segments 421 includes a conductive tab 422 that is electrically connected to at least some of the vias 405 thereby supplying power to the first ring segments 421. Some of the longer first ring segments 421 can be connected to two or more vias to provide a more even power distribution across the segment 421. For example, one via can be connected with a conductive tab 422 and another via can be connected with the main portion of the segment 421. Typically, the conductive tabs 422 are arranged so that they pass through spaces between the conductive second ring segments 431. In this way, a high density of power segments 421, 431 can be configured in a very small area without needing to use the I/O contacts (e.g., 440) to supply power to the die 402. The inventors contemplate other arrangements for the power ring segments wherein, for example, there are no conductive tabs or wherein the segments are not arranged in a staggered configuration (e.g., wherein the segments are arranged adjacent to each other in a single ring around the die).

The die 402 can be electrically connected to the power segments 421, 431 by wire connections that are typically constructed using methods to those having ordinary skill in the art. Such wire connections are typically formed using bonding wires 450 that are typically on the order of about 100–250 mils long and constructed of gold. As depicted, the bonding wires 450 are electrically connected to bond pads 406 on the die 402 and to the power segments 421, 431, thereby establishing power contacts to the die 402. Additionally, the bond pads 406 on the die 402 can be connected with the ground ring 410 to provide ground for the various system busses on the die 402. The inventors also contemplate that the ground ring 410 can be segmented into a plurality of ground ring segments as are the depicted power rings. Such an implementation can provide improved system bus isolation where needed.

Again it is to be stressed that the embodiment depicted in FIG. 4 is a simplified schematic depiction of an often far more complicated package design. For example, in FIG. 4 there is a first power ring and a second power ring (each comprised of many ring segments (e.g., 421, 431)) encompassing a ground ring 410. The inventors contemplate that embodiments including additional third, fourth, or more power rings can be constructed. Moreover, each of these additional power rings can be configured as a plurality of power ring segments. Additionally, the vias can be located at, or near, the center of the segmented power rings (e.g., 431) rather than at the edges.

FIG. 5 depicts a simplified schematic top down view of another implementation of a BGA package constructed in accordance with the principles of the invention. A front side of a substrate 501 is depicted. A die attachment region 502 is shown near the middle of the substrate 501. The substrate 501 includes a plurality of vias 510 that are used to facilitate electrical connections throughout the package. Also, depicted are a plurality of traces which are also used to facilitate electrical connections throughout the package. In particular, the traces 511 are used to supply electrical connections to I/O solder balls mounted on the back side (not shown in this view) of the package. Also depicted are a ground ring 520 and power rings. A first power ring formed of first power ring segments 531 is shown. Also depicted is a second power ring formed of second power ring segments 541. The depicted ring segments 531, 541 are arranged in staggered configuration with respect to each other. The depicted first ring segments 531 also include conductive tabs 532 that extend to associated vias 510. In the depicted embodiment, the conductive tabs 532 extend through the spaces between the second power ring segments 541. The depicted embodiment also shows that the endmost (and longer) first power ring segments 541 are supplied power through two vias 510. The reader is reminded that the illustrations and descriptions contained herein are descriptive of certain preferred embodiments of the invention and are not intended to limit the scope of the invention. Although depicted here as having 44 first and second power ring segments, embodiments having in the range of twenty to sixty power ring segments are well contemplated by the inventors. Alternatively, embodiments having fewer or more power ring segments are also contemplated by the inventors. Additionally, the inventors contemplate that the ground ring can be split into several segements. Such an implementation can provide, among other things, improved circuit isolation and reduced noise in systems of the die.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated that the number of power segments can vary considerably with preferred implementations having between 32 and 44 first and second power segments. Additionally, the inventors specifically point out that the ground ring can be configured as a plurality of ground ring segments which can be used as independent grounds. Further, reference in the claims to an element in the singular is not intended to mean "one and only one" unless explicitly stated, but rather, "at least one". Furthermore, the embodiments illustratively disclosed herein can be practiced without any element which is not specifically disclosed herein.

We claim:

1. A BGA package, which comprises:
a substrate having a front side and a back side;
a die attachment region formed on the front side of the substrate;
an electrically conductive first power ring that includes a plurality of spaced apart conductive first ring segments formed on the front side of the substrate, the first ring segments being arranged around the die attachment region;
an electrically conductive second power ring that includes a plurality of spaced apart conductive second ring segments formed on the front side of the substrate, the second ring segments being arranged around the die attachment region and positioned at a greater distance from the die attachment region than the first ring segments;
a plurality of vias penetrating through the substrate, including: a subgroup of first vias which are connected to the first ring segments of the first power ring; and a subgroup of second vias which are connected to the second ring segments of the second power ring;
a semiconductor die mounted over the die attachment region on the front side of the substrate, the semiconductor chip having a plurality of bond pads;
bonding wires for connecting the plurality of bond pads of the die to associated first ring segments and second ring segments;
wherein the each of the first ring segments includes a conductive tab that electrically connects the first ring segments to at least some of the first vias; and
wherein the conductive tabs of the first ring segments are arranged so that they pass through spaces between the plurality of spaced apart conductive second ring segments.

2. The BGA package of claim 1, further including a third conductive ring arranged around the die attachment region and positioned at a closer distance to the die attachment region than the first and second power rings.

3. The BGA package of claim 2, wherein the third conductive ring is a ground ring.

4. The BGA package of claim 3, wherein the ground ring is formed of a plurality of spaced apart conductive ground ring segments, at least some of the ground ring segments being independently grounded.

5. The BGA package of claim 1, wherein each of the first ring segments of the first power ring and each of the second ring segments of the second power ring comprise separate power sources.

6. The BGA package of claim 1, wherein the plurality of spaced apart conductive first ring segments are arranged in staggered configuration relative to the plurality of spaced apart conductive second ring segments.

7. The BGA package of claim 1, wherein the each of the first ring segments is connected to at least two of the first vias.

8. The BGA package of claim 7, wherein the each of the first ring segments includes a conductive tab that electrically connects each first ring segment to an associated one of the first vias; and
wherein the conductive tabs of the first ring segments are arranged so that they pass through spaces between the plurality of spaced apart conductive second ring segments.

9. The BGA package of claim 7, wherein the first ring segments of the first power ring are longer than the second ring segments of the second power ring.

10. A BGA package as in claim 1 further including an encapsulation layer which protectively encases the front side of the substrate encasing at least a portion of the semiconductor die and the bonding wires; and
a plurality of solder balls formed on the back side of the substrate, at least some of the solder balls being electrically connected to the vias.

11. A BGA package as in claim 1 wherein the first power ring includes sixteen (16) spaced apart conductive first ring segments; and
wherein the second power ring includes sixteen (16) spaced apart conductive second ring segments.

12. A BGA package as in claim 1 wherein the first power ring includes twenty four (24) spaced apart conductive first ring segments; and
wherein the second power ring includes twenty (20) spaced apart conductive second ring segments.

13. A BGA package, which comprises:
a substrate having an integrated circuit die mounted on the front side of the substrate;
an electrically conductive first power ring that includes a plurality of spaced apart conductive first ring segments formed on the front side of the substrate around the die;
an electrically conductive second power ring that includes a plurality of spaced apart conductive second ring segments formed on the front side of the substrate, the second ring segments also being arranged around the die;

an electrically conductive ground ring formed on the front side of the substrate around the die;

a plurality of vias penetrating through the substrate including: a subgroup of first vias which are connected to the first ring segments of the first power ring; a subgroup of second vias which are connected to the second ring segments of the second power ring; and a subgroup of ground vias which are connected to the ground ring;

bonding wires for connecting the die to the first ring segments, second ring segments, and ground ring;

wherein the each of the first ring segments includes a conductive tab that electrically connects the first ring segments to at least some of the first vias; and wherein the conductive tabs of the first ring segments are arranged so that they pass through spaces between the plurality of spaced apart conductive second ring segments.

14. The BGA package of claim 13, wherein at least some of the first ring segments and the second ring segments provide independent power sources to electronic systems contained within the die.

15. The BGA package of claim 13, wherein the plurality of spaced apart conductive first ring segments are arranged in staggered configuration relative to the plurality of spaced apart conductive second ring segments.

16. The BGA package of claim 13, wherein the ground ring is formed of a plurality of spaced apart conductive ground ring segments, at least some of the ground ring segments being independently grounded.

17. The BGA package of claim 13, wherein at least a portion of the die and bonding wires are contained within an encapsulant.

18. A BGA substrate, which comprises:

a substrate having a die attachment region formed on a front side of the substrate;

an electrically conductive first power ring that includes a plurality of spaced apart conductive first ring segments formed on the front side of the substrate, the first ring segments being arranged around the die attachment region;

an electrically conductive second power ring that includes a plurality of spaced apart conductive second ring segments formed on the front side of the substrate, the second ring segments being arranged around the die attachment region and positioned at a greater distance from the die attachment region than the first ring segments;

a plurality of vias penetrating through the substrate, including:
  a subgroup of first vias which are connected to the first ring segments of the first power ring; and
  a subgroup of second vias which are connected to the second ring segments of the second power ring;

each of the first ring segments includes a conductive tab that electrically connects the first ring segments to at least some of the first vias; and the conductive tabs of the first ring segments are arranged so that they pass through spaces between the plurality of spaced apart conductive second ring segments.

19. The BGA package of claim 18, further including a third conductive ring arranged around the die attachment region and positioned at a closer distance to the die attachment region than the first and second power rings.

20. The BGA package of claim 19, wherein the third conductive ring is a ground ring.

21. The BGA package of claim 20, wherein the ground ring is formed of a plurality of spaced apart conductive ground ring segments, at least some of the ground ring segments being independently grounded.

22. The BGA package of claim 18, wherein each of the first ring segments of the first power ring and each of the second ring segments of the second power ring comprise separate power sources.

23. The BGA package of claim 18, wherein the each of the first ring segments is connected to at least two of the first vias.

24. A BGA package as in claim 18, further including a plurality of solder balls formed on the back side of the substrate, at least some of the solder balls being electrically connected to the vias.

25. A BGA package as in claim 18 wherein the first power ring includes sixteen (16) spaced apart conductive first ring segments; and wherein the second power ring includes sixteen (16) spaced apart conductive second ring segments.

26. A BGA package as in claim 18 wherein the first power ring includes twenty four (24) spaced apart conductive first ring segments; and wherein the second power ring includes twenty (20) spaced apart conductive second ring segments.

* * * * *